United States Patent
Qiu et al.

(10) Patent No.: US 10,126,148 B2
(45) Date of Patent: Nov. 13, 2018

(54) NON-CONTACT TRANSFORMER DETECTION METHOD, DEVICE AND COMPUTER STORAGE MEDIUM

(71) Applicant: ZTE Corporation, Shenzhen, Guangdong (CN)

(72) Inventors: Beibei Qiu, Shenzhen (CN); Wei Liu, Shenzhen (CN); Yong Luo, Shenzhen (CN); Jianping Zhou, Shenzhen (CN); Jie Fan, Shenzhen (CN)

(73) Assignee: ZTE Corporation, Shenzhen, Guangdong (CN)

( * ) Notice: Subject to any disclaimer, the term of this patent is extended or adjusted under 35 U.S.C. 154(b) by 326 days.

(21) Appl. No.: 15/022,620

(22) PCT Filed: Jun. 17, 2014

(86) PCT No.: PCT/CN2014/080120
§ 371 (c)(1),
(2) Date: Mar. 17, 2016

(87) PCT Pub. No.: WO2015/043242
PCT Pub. Date: Apr. 2, 2015

(65) Prior Publication Data
US 2016/0238411 A1    Aug. 18, 2016

(30) Foreign Application Priority Data

Sep. 27, 2013   (CN) .......................... 2013 1 0452518

(51) Int. Cl.
*G01D 5/20*     (2006.01)
*H02J 17/00*    (2006.01)
(Continued)

(52) U.S. Cl.
CPC ............. *G01D 5/204* (2013.01); *G01R 25/00* (2013.01); *G01R 31/42* (2013.01); *H02J 5/005* (2013.01);
(Continued)

(58) Field of Classification Search
CPC .......... G01D 5/204; H02J 50/10; H02J 50/90; H02J 5/005; H02J 17/00; G01R 31/42; G01R 25/00
See application file for complete search history.

(56) References Cited

U.S. PATENT DOCUMENTS 7,843,707 B2 * 11/2010 Chen ........................ H02J 5/005
363/17
9,627,917 B2 * 4/2017 Yan ........................ H02J 7/0042
(Continued)

FOREIGN PATENT DOCUMENTS

CN     101334464 A     12/2008
CN     101834473 A      9/2010
(Continued)

OTHER PUBLICATIONS

Wei Zhang, Siu-Chung Wong, Chi K. Tse, Qianhong Chen, Analysis and Comparison of Secondary Series- and Parallel-Compensated IPT Systems, 2013 IEEE Energy Conversion Congress and Exposition, IEEE Sep. 15, 2013, (Sep. 15, 2013), pp. 2898-2903.*
(Continued)

*Primary Examiner* — Jared Fureman
*Assistant Examiner* — Michael Warmflash
(74) *Attorney, Agent, or Firm* — Cooper Legal Group, LLC

(57) ABSTRACT

Disclosed is a detection method, a detection device and a computer storage medium for a non-contact transformer. The method includes that: a circuit parameter is acquired; the acquired circuit parameter is compared with a pre-stored
(Continued)

circuit parameter corresponding to known air gap and dislocation distance information; and air gap and dislocation distance information of the non-contact transformer in a wireless energy transmission system are determined according to a comparison result.

7 Claims, 2 Drawing Sheets

(51) Int. Cl.
  *H02J 5/00* (2016.01)
  *G01R 25/00* (2006.01)
  *G01R 31/42* (2006.01)
  *H02J 50/90* (2016.01)
  *H02J 50/10* (2016.01)
  *H02J 7/00* (2006.01)

(52) U.S. Cl.
  CPC ............ *H02J 17/00* (2013.01); *H02J 50/10* (2016.02); *H02J 50/90* (2016.02)

(56) References Cited

U.S. PATENT DOCUMENTS

| | | | |
|---|---|---|---|
| 2008/0157909 A1 | 7/2008 | Chen | |
| 2011/0074219 A1* | 3/2011 | Villa Gazulla | H02J 5/005 307/104 |
| 2012/0146424 A1 | 6/2012 | Urano | |
| 2012/0169133 A1* | 7/2012 | Lisi | H02J 5/005 307/104 |
| 2012/0262000 A1 | 10/2012 | Urano | |
| 2013/0154386 A1 | 6/2013 | Bae | |
| 2013/0214591 A1* | 8/2013 | Miller | H02J 5/005 307/9.1 |
| 2014/0333150 A1* | 11/2014 | Iwawaki | B60L 11/1812 307/104 |

FOREIGN PATENT DOCUMENTS

| | | | |
|---|---|---|---|
| CN | 102064615 A | 5/2011 | |
| CN | 103166328 A | 6/2013 | |
| CN | 103166474 A | 6/2013 | |
| CN | 103560593 A | 2/2014 | |
| JP | H09215211 A | 8/1997 | |
| JP | 2001275280 A | 10/2001 | |
| JP | 2005006460 A | 1/2005 | |
| JP | 2008206231 A | 9/2008 | |
| JP | 2008295297 A | 12/2008 | |
| JP | 2011010384 A | 1/2011 | |
| JP | 2012170271 A | 9/2012 | |
| KR | 20130007173 A | 1/2013 | |
| WO | 2012111085 A1 | 8/2012 | |
| WO | 2013002488 A1 | 1/2013 | |
| WO | 2013012088 A1 | 1/2013 | |
| WO | WO 2013002488 A1 * | 1/2013 | ............ H02J 17/00 |
| WO | 2013111307 A1 | 8/2013 | |
| WO | 2013111469 A1 | 8/2013 | |

OTHER PUBLICATIONS

International Search Report in international application No. PCT/CN2014/080120, dated Sep. 4, 2014, 2 pgs.

English Translation of the Written Opinion of the International Search Authority in international application No. PCT/CN2014/080120, dated Sep. 4, 2014, 8 pgs.

Supplementary European Search Report in European application No. 14847721.9, dated Jul. 29, 2016, 8 pgs.

Zhang Wei et al: "Analysis and comparison of secondary series- and parallel-compensated IPT systems",2013 IEEE Energy Conversion Congress and Exposition, IEEE, Sep. 15, 2013 (Sep. 15, 2013),pp. 2898-2903, XP032516247,DO I: 10 .1109 / ECCE. 2013. 6647078,[retrieved on Oct. 24, 2013],mailed on Sep. 15, 2013, 6 pgs.

* cited by examiner

NON-CONTACT TRANSFORMER DETECTION METHOD, DEVICE AND COMPUTER STORAGE MEDIUM

TECHNICAL FIELD

The present disclosure relates to detection technology and, in particular to a detection method, a detection device and a computer storage medium for a non-contact transformer.

BACKGROUND

A wireless energy transmission system consists of two parts which are separated from each other, and includes a sender, a receiver, a power grid and a load. The sender and the receiver are physically disconnected, and energy is transmitted mainly through a non-contact transformer. A non-contact transformer serves as a main part capable of wirelessly transmitting energy in the wireless energy transmission system. Both an air gap and a dislocation distance between primary and secondary windings may influence energy transmission and control of the system. Only in the case that the primary and secondary windings of the non-contact transformer are aligned with each other and there is a certain air gap between the primary and secondary windings, the wireless energy transmission system may efficiently transmit energy.

On one hand, the change in the air gap and dislocation between the primary and secondary windings of the non-contact transformer will influence energy transmission efficiency of the system. On the other hand, the stability of the system will be influenced. When the air gap between the primary and secondary windings of the transformer exceeds a certain range or the primary and secondary windings are seriously dislocated, the system will even not run.

Therefore, it is an important key for stable and efficient running of the wireless energy transmission system to rapidly and accurately detect the air gap and dislocation information between the primary and secondary sides of the non-contact transformer.

SUMMARY

In order to solve the problems in the conventional technology, the embodiments of the present disclosure provide a detection method, a detection device and a computer storage medium for a non-contact transformer, which may rapidly and accurately detect the air gap and dislocation information between the primary and secondary sides of the non-contact transformer.

The technical solutions based on the embodiments of the present disclosure are implemented as follows.

The embodiments of the present disclosure provide a detection method for a non-contact transformer, which is applied to a wireless energy transmission system and includes:

a circuit parameter is acquired;

the acquired circuit parameter is compared with a pre-stored circuit parameter corresponding to known air gap and dislocation distance information; and air gap and dislocation distance information of the non-contact transformer in the wireless energy transmission system are determined according to a comparison result.

Preferably, the circuit parameter of the wireless energy transmission system may include: a circuit parameter of a sender, a circuit parameter of a receiver and a coupling coefficient of the non-contact transformer, wherein the circuit parameter of the sender may include at least one of the following parameters: a phase angle between voltage and current and a value of switching frequency; and the circuit parameter of the receiver may include at least one of the following parameters: a voltage value and a current value.

Preferably, the step that the air gap and dislocation distance information of the non-contact transformer in the system are determined according to the comparison result may include that:

when the non-contact transformer has a serial-parallel compensation structure and an acquired coupling coefficient of the transformer is lower than a pre-stored coupling coefficient of the non-contact transformer, it is determined that the air gap of the non-contact transformer is enlarged or the non-contact transformer is dislocated; and when the acquired coupling coefficient of the transformer is greater than the pre-stored coupling coefficient of the non-contact transformer, it is determined that the air gap of the non-contact transformer is reduced.

Preferably, the step that the air gap and dislocation distance information of the non-contact transformer in the system are determined according to the comparison result may include that:

when the non-contact transformer has a serial-parallel compensation structure and an acquired phase angle between voltage and current at the sender under a constant frequency is larger than a pre-stored phase angle between voltage and current at the sender under the constant frequency, it is determined that the air gap of the non-contact transformer is enlarged or the non-contact transformer is dislocated; and when the acquired phase angle between voltage and current at the sender under the constant frequency is smaller than the pre-stored phase angle between voltage and current of the sender under the constant frequency, it is determined that the air gap of the non-contact transformer is reduced.

Preferably, the step that the air gap and dislocation distance information of the non-contact transformer in the system are determined according to the comparison result may include that:

when the non-contact transformer has a serial-parallel compensation structure, an acquired rectified voltage value at the receiver is greater than a pre-stored rectified voltage value at the receiver and an acquired current value at the receiver is smaller than a pre-stored current value at the receiver, it is determined that the air gap of the non-contact transformer is enlarged or the non-contact transformer is dislocated; and when the acquired rectified voltage value at the receiver is smaller than the pre-stored rectified voltage value at the receiver and the acquired current value at the receiver is greater than the pre-stored current value at the receiver, it is determined that the air gap of the non-contact transformer is reduced.

Preferably, the step that the air gap and dislocation distance information of the non-contact transformer in the system are determined according to the comparison result may include that:

when the non-contact transformer has a serial-parallel compensation structure, an impedance characteristic and a voltage gain of the non-contact transformer are monotonic, the phase angle between voltage and current of the sender is unchanged and an acquired value of switching frequency is greater than a pre-stored value of switching frequency of the sender, it is determined that the air gap of the non-contact transformer is enlarged or the non-contact transformer is dislocated; and when the acquired value of switching frequency is smaller than the pre-stored value of switching frequency of the sender, it is determined that the air gap of the non-contact transformer is reduced.

Preferably, the step that the air gap and dislocation distance information of the non-contact transformer in the system are determined according to the comparison result may include that:

when the non-contact transformer has a serial-parallel compensation structure, an impedance characteristic and a voltage gain of the non-contact transformer are non-monotonic, a phase angle between voltage and current of the sender is unchanged and the acquired value of switching frequency is smaller than the pre-stored value of switching frequency of the sender, it is determined that the air gap of the non-contact transformer is enlarged or the non-contact transformer is dislocated; and when the acquired value of switching frequency is greater than the pre-stored value of switching frequency of the sender, it is determined that the air gap of the non-contact transformer is reduced.

The embodiments of the present disclosure further provide a detection device for a non-contact transformer including: an acquisition unit, a storage unit, a comparison unit and a determination unit, wherein the acquisition unit is configured to acquire a circuit parameter;

the storage unit is configured to store a circuit parameter corresponding to known air gap and dislocation distance information;

the comparison unit is configured to compare the circuit parameter acquired by the acquisition unit with the circuit parameter stored by the storage unit; and the determination unit is configured to determine air gap and dislocation distance information of the non-contact transformer in a wireless energy transmission system according to a comparison result from the comparison unit.

Preferably, the circuit parameter, acquired by the acquisition unit, of the wireless energy transmission system may include: a circuit parameter of a sender, a circuit parameter of a receiver and a coupling coefficient of the non-contact transformer, wherein the circuit parameter of the sender may include at least one of the following parameters: a phase angle between voltage and current and a value of switching frequency; and the circuit parameter of the receiver may include at least one of the following parameters: a voltage value and a current value.

Preferably, the determination unit may be configured to, when the non-contact transformer has a serial-parallel compensation structure and the comparison result from the comparison unit indicates that an acquired coupling coefficient of the transformer is lower than a pre-stored coupling coefficient of the non-contact transformer, determine that an air gap of the non-contact transformer is enlarged or the non-contact transformer is dislocated; and when the comparison result from the comparison unit indicates that the acquired coupling coefficient of the transformer is greater than the pre-stored coupling coefficient of the non-contact transformer, determine that the air gap of the non-contact transformer is reduced.

Preferably, the determination unit may be configured to, when the non-contact transformer has a serial-parallel compensation structure and the comparison result from the comparison unit indicates that an acquired phase angle between voltage and current of the sender under a constant frequency is larger than a pre-stored phase angle between voltage and current of the sender under the constant frequency, determine that the air gap of the non-contact transformer is enlarged or the non-contact transformer is dislocated; and when the comparison result from the comparison unit indicates that the acquired phase angle between voltage and current of the sender under the constant frequency is smaller than the pre-stored phase angle between voltage and current of the sender under the constant frequency, determine that the air gap of the non-contact transformer is reduced.

Preferably, the determination unit may be configured to, when the non-contact transformer has a serial-parallel compensation structure and the comparison result from the comparison unit indicates that an acquired rectified voltage value of the receiver is greater than a pre-stored rectified voltage value of the receiver and an acquired current value of the receiver is smaller than a pre-stored current value of the receiver, determine that the air gap of the non-contact transformer is enlarged or the non-contact transformer is dislocated; and when the comparison result from the comparison unit indicates that the acquired rectified voltage value of the receiver is smaller than the pre-stored rectified voltage value of the receiver and the acquired current value of the receiver is greater than the pre-stored current value of the receiver, determine that the air gap of the non-contact transformer is reduced.

Preferably, the determination unit may be configured to, when the non-contact transformer has a serial-parallel compensation structure, an impedance characteristic and a voltage gain of the non-contact transformer are monotonic, the phase angle between voltage and current of the sender is unchanged and the comparison result from the comparison unit indicates that an acquired value of switching frequency is greater than a pre-stored value of switching frequency of the sender, determine that the air gap of the non-contact transformer is enlarged or the non-contact transformer is dislocated; and when the comparison result from the comparison unit indicates that the acquired value of switching frequency is smaller than the pre-stored value of switching frequency of the sender, determine that the air gap of the non-contact transformer is reduced.

Preferably, the determination unit may be configured to, when the non-contact transformer has a serial-parallel compensation structure, the impedance characteristic and the voltage gain of the non-contact transformer are non-monotonic, the phase angle between voltage and current of the sender is unchanged and the comparison result from the comparison unit indicates that the acquired value of switching frequency is smaller than the pre-stored value of switching frequency of the sender, determine that the air gap of the non-contact transformer is enlarged or the non-contact transformer is dislocated; and when the comparison result from the comparison unit indicates that the acquired value of switching frequency is greater than the pre-stored value of switching frequency of the sender, determine that the air gap of the non-contact transformer is reduced.

The embodiment of the present disclosure further provides a computer storage medium, in which computer-executable instructions are stored and are configured to execute the detection method for the non-contact transformer according to the embodiments of the present disclosure.

According to the detection method, the detection device and the computer storage medium for the non-contact transformer provided by the embodiments of the present disclosure, the circuit parameter of the wireless energy transmission system is acquired, the acquired circuit parameter is compared with the pre-stored circuit parameter corresponding to the known air gap and dislocation distance information of the wireless energy transmission system, and the air gap and dislocation distance information of the non-contact transformer in the wireless energy transmission system are determined according to the comparison result. As such, the air gap and dislocation information of the non-contact transformer may be determined according to the circuit parameter of the wireless energy transmission system without other additional detection devices, so that the manpower consumption and expenses in material resources are greatly reduced, the detection flow is simplified and the efficiency of detection is improved.

DETAILED DESCRIPTION

Figure 1:
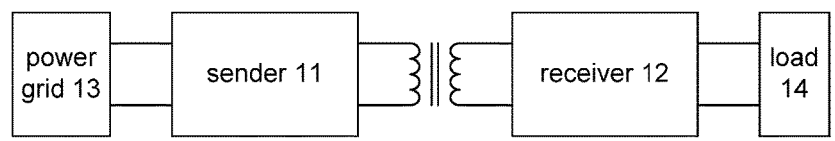
FIG. 1 is a diagram illustrating an application scenario according to an embodiment of the present disclosure.

The embodiments of the present disclosure are applied to the scenario as shown in FIG. 1. FIG. 1 is a diagram illustrating an application scenario according to an embodiment of the present disclosure. As shown in FIG. 1, the wireless energy transmission system includes a sender 11, a receiver 12, a power grid 13 and a load 14. The sender 11 is connected to the power grid 13. The receiver 12 is connected to the load 14. The sender 11 generates an alternating current signal which may be transmitted through a transformer. The energy is transmitted through the non-contact transformer. The receiver 12 converts the signal received through the transformer into an electrical signal required by the load. The sender 11 and the receiver 12 are physically disconnected with each other, and the energy is transmitted mainly through the non-contact transformer.

Figure 2:
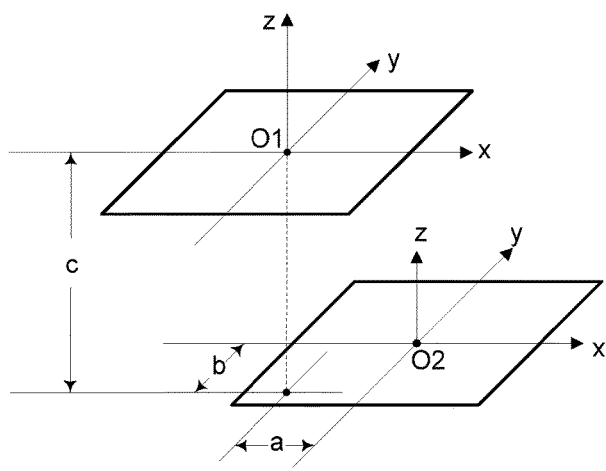
FIG. 2 is a diagram illustrating an air gap and dislocation in a non-contact transformer according to an embodiment of the present disclosure.

FIG. 2 is a diagram illustrating an air gap and dislocation in a non-contact transformer according to an embodiment of the present disclosure. As shown in FIG. 2, point O1 and point O2 are positions of central points of a primary winding and a secondary winding of the non-contact transformer respectively. Distances a and b are dislocation distances between the primary winding and the secondary winding in an x direction and a y direction respectively. Distance c is an air gap between the primary winding and the secondary winding.

The embodiments of the present disclosure are applied to the abovementioned scenario.

The present disclosure will be further described below with reference to the accompanying drawings and specific embodiments in detail.

Figure 3:
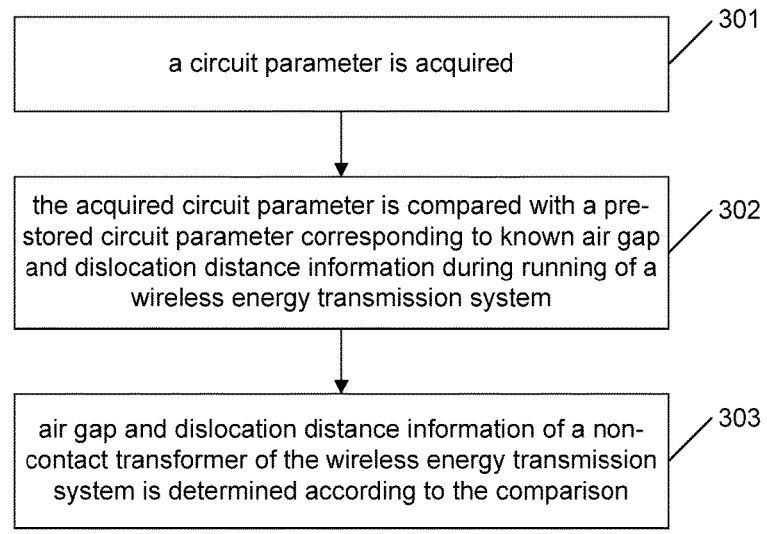
FIG. 3 is a flowchart showing a detection method for a non-contact transformer according to an embodiment of the present disclosure.

The embodiments of the present disclosure provide a detection method for a non-contact transformer, which is applied to the abovementioned wireless energy transmission system. FIG. 3 is a flowchart illustrating a detection method for a non-contact transformer according to an embodiment of the present disclosure, and as shown in FIG. 3, the method includes the following steps.

At Step 301, a circuit parameter is acquired.

The circuit parameter of the wireless energy transmission system includes a circuit parameter of a sender, a circuit parameter of a receiver and a coupling coefficient of the non-contact transformer.

The circuit parameter of the sender includes at least one of the following parameters: a phase angle between voltage and current and a value of switching frequency.

The circuit parameter of the receiver includes at least one of the following parameters a voltage value and a current value.

At Step 302, the acquired circuit parameter is compared with a pre-stored circuit parameter corresponding to known air gap and dislocation distance information during running of the wireless energy transmission system.

In the embodiment, the wireless energy transmission system pre-stores a circuit parameter of the system in a certain running state, and the circuit parameter corresponds to the known air gap and dislocation distance information during running of the system. Preferably, the pre-stored circuit parameter may be a standard circuit parameter which is pre-detected in an optimal running state of the wireless energy transmission system. In this case, if a running state, corresponding to the acquired circuit parameter, of the wireless energy transmission system is better than that corresponding to the stored circuit parameter, the system updates the stored circuit parameter.

At Step 303, air gap and dislocation distance information of a non-contact transformer of the wireless energy transmission system is determined according to a comparison result.

Here, the determination of the air gap and dislocation distance information of the non-contact transformer of the wireless energy transmission system according to the comparison result is related to a former-later stage compensation structure of the non-contact transformer in the wireless energy transmission system. In the embodiment, a serial-parallel compensation structure as an example is further described in detail.

Specifically, when the compensation structure of the non-contact transformer is the serial-parallel compensation structure and an acquired coupling coefficient of the transformer is lower than a pre-stored coupling coefficient thereof, it is determined that an air gap of the non-contact transformer is enlarged or the non-contact transformer has a dislocation. When the acquired coupling coefficient of the transformer is greater than the pre-stored coupling coefficient thereof, it is determined that the air gap of the non-contact transformer is reduced.

Alternatively, when the compensation structure of the non-contact transformer is the serial-parallel compensation structure and an acquired phase angle between a voltage value and current of the sender under a constant frequency is larger than a pre-stored phase angle between the voltage value and current of the sender under the constant frequency, it is determined that the air gap of the non-contact transformer is enlarged or the non-contact transformer has a dislocation. When the acquired phase angle between the voltage value and current of the sender under the constant frequency is smaller than the pre-stored phase angle between the voltage value and current of the sender under the constant frequency, it is determined that the air gap of the non-contact transformer is reduced.

Alternatively, when the compensation structure of the non-contact transformer is the serial-parallel compensation structure, an acquired rectified voltage value at the receiver is greater than a pre-stored rectified voltage value at the receiver and an acquired current value at the receiver is smaller than a pre-stored current value at the receiver, it is determined that the air gap of the non-contact transformer is enlarged or the non-contact transformer has a dislocation. When the acquired rectified voltage value at the receiver is smaller than the pre-stored rectified voltage value of the receiver and the acquired current value of the receiver is greater than the pre-stored current value of the receiver, it is determined that the air gap of the non-contact transformer is reduced.

Alternatively, when the compensation structure of the non-contact transformer is the serial-parallel compensation structure, an impedance characteristic and a voltage gain of the non-contact transformer are monotonic, the phase angle between the voltage value and current of the sender is unchanged and an acquired value of switching frequency is greater than a pre-stored value of switching frequency of the sender, it is determined that the air gap of the non-contact transformer is enlarged or the non-contact transformer has a dislocation. When the acquired value of switching frequency is smaller than the pre-stored value of switching frequency of the sender, it is determined that the air gap of the non-contact transformer is reduced.

Alternatively, when the compensation structure of the non-contact transformer is the serial-parallel compensation structure, the impedance characteristic and a voltage gain of the non-contact transformer are non-monotonic, the phase angle between the voltage value and current of the sender is unchanged and the acquired value of switching frequency is smaller than the pre-stored value of switching frequency of the sender, it is determined that the air gap of the non-contact transformer is enlarged or the non-contact transformer has a dislocation. When the acquired value of switching frequency is greater than the pre-stored value of switching frequency of the sender, it is determined that the air gap of the non-contact transformer is reduced.

Here, the former-later stage compensation structure specifically compensates primary and secondary windings by adding capacitors to the primary and secondary windings of the non-contact transformer. Specifically, the former-later stage serial-parallel compensation structure refers to a structure in which a capacitor is in series connected to the primary winding of the non-contact transformer and a capacitor in parallel connected to the secondary winding.

In the embodiment, after the air gap and dislocation information of the non-contact transformer is determined based on the acquired circuit parameter, the positions of the primary and secondary windings of the transformer are regulated to enable the wireless energy transmission system to efficiently and stably transmit energy.

The embodiments of the present disclosure further provide a computer storage medium, in which computer-executable instructions are stored, the computer-executable instructions being configured to execute the detection method for the non-contact transformer according to the embodiments of the present disclosure.

Figure 4:
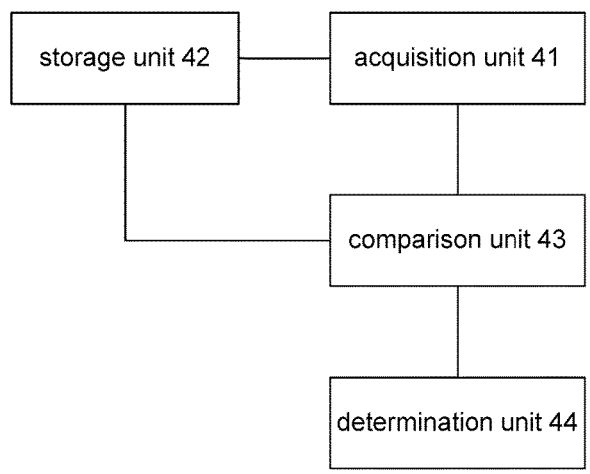
FIG. 4 is a structure diagram illustrating a detection device for a non-contact transformer according to an embodiment of the present disclosure.

Based on the abovementioned method, the embodiments of the present disclosure further provide a detection device for a non-contact transformer, which is applied to a wireless energy transmission system. FIG. 4 is a structure diagram illustrating a detection device for a non-contact transformer according to an embodiment of the present disclosure, and as shown in FIG. 4, the device includes an acquisition unit 41, a storage unit 42, a comparison unit 43 and a determination unit 44.

The acquisition unit 41 is configured to acquire a circuit parameter.

The storage unit 42 is configured to store a circuit parameter corresponding to known air gap and dislocation distance information.

The comparison unit 43 is configured to compare the circuit parameter acquired by the acquisition unit 41 with the circuit parameter stored by the storage unit 42.

The determination unit 44 is configured to determine air gap and dislocation distance information of the non-contact transformer in the wireless energy transmission system according to a comparison result from the comparison unit 43.

Here, the circuit parameter stored by the storage unit 42 is a circuit parameter of the wireless energy transmission system in a certain running state, and the circuit parameter corresponds to the known air gap and dislocation distance information during running of the system. Preferably, the pre-stored circuit parameter may be a standard circuit parameter which is pre-detected in an optimal running state of the wireless energy transmission system. In this case, if a running state, corresponding to the acquired circuit parameter acquired by the acquisition unit 41, of the wireless energy transmission system is better than that corresponding to the stored circuit parameter, the storage unit 42 updates the stored circuit parameter.

Here, the circuit parameter, acquired by the acquisition unit 41, of the wireless energy transmission system includes a circuit parameter of a sender, a circuit parameter of a receiver and a coupling coefficient of the non-contact transformer.

The circuit parameter of the sender includes at least one of the following parameters: a phase angle between voltage and current and a value of switching frequency.

The circuit parameter of the receiver includes at least one of the following parameters a voltage value and a current value.

Specifically, the determination unit 44 is configured to, when a compensation structure of the non-contact transformer is a serial-parallel compensation structure and the comparison result from the comparison unit 43 is that an acquired coupling coefficient of the transformer is lower than a pre-stored coupling coefficient of the non-contact transformer, determine that an air gap of the non-contact transformer is enlarged or the non-contact transformer has a dislocation. When the comparison result from the comparison unit 43 is that the acquired coupling coefficient of the transformer is greater than the pre-stored coupling coefficient of the non-contact transformer, the determination unit 44 is configured to determine that the air gap of the non-contact transformer is reduced.

Alternatively, the determination unit 44 is configured to, when the compensation structure of the non-contact transformer is the serial-parallel compensation structure and the comparison result from the comparison unit 43 is that an acquired phase angle between a voltage value and current of the sender under a constant frequency is larger than a pre-stored phase angle between the voltage value and current of the sender under the constant frequency, determine that the air gap of the non-contact transformer is enlarged or the non-contact transformer has a dislocation. When the comparison result from the comparison unit 43 is that the acquired phase angle between the voltage value and current of the sender under the constant frequency is smaller than the pre-stored phase angle between the voltage value and current of the sender under the constant frequency, the determination unit 44 is configured to determine that the air gap of the non-contact transformer is reduced.

Alternatively, the determination unit 44 is configured to, when the compensation structure of the non-contact transformer is the serial-parallel compensation structure and the comparison result from the comparison unit 43 is that an acquired rectified voltage value at the receiver is greater than a pre-stored rectified voltage value of the receiver and an acquired current value of the receiver is smaller than a pre-stored current value of the receiver, determine that the air gap of the non-contact transformer is enlarged or the non-contact transformer has a dislocation. When the comparison result from the comparison unit 43 is that the acquired rectified voltage value at the receiver is smaller than the pre-stored rectified voltage value at the receiver and the acquired current value at the receiver is greater than the pre-stored current value at the receiver, the determination unit 44 is configured to determine that the air gap of the non-contact transformer is reduced.

Alternatively, the determination unit 44 is configured to, when the compensation structure of the non-contact transformer is the serial-parallel compensation structure, an impedance characteristic and a voltage gain of the non-contact transformer are monotonic, the phase angle between the voltage value and current of the sender is unchanged and the comparison result from the comparison unit 43 is that an acquired value of switching frequency is greater than a pre-stored value of switching frequency of the sender, determine that the air gap of the non-contact transformer is enlarged or the non-contact transformer has a dislocation. When the comparison result from the comparison unit 43 is that the acquired value of switching frequency is smaller than the pre-stored value of switching frequency of the sender, the determination unit 44 is configured to determine that the air gap of the non-contact transformer is reduced.

Alternatively, the determination unit 44 is configured to, when the compensation structure of the non-contact transformer is the serial-parallel compensation structure, the impedance characteristic and a voltage gain of the non-contact transformer are non-monotonic, the phase angle between the voltage value and current of the sender is unchanged and the comparison result from the comparison unit 43 is that the acquired value of switching frequency is smaller than the pre-stored value of switching frequency of the sender, determine that the air gap of the non-contact transformer is enlarged or the non-contact transformer has a dislocation. When the comparison result from the comparison unit 43 is that the acquired value of switching frequency is greater than the pre-stored value of switching frequency of the sender, the determination unit 44 is configured to determine that the air gap of the non-contact transformer is reduced.

In practice, the detection device for the non-contact transformer according to the embodiments of the present disclosure may be implemented by the sender or receiver in the wireless energy transmission system shown in FIG. 1. In practice, the acquisition unit 41 of the detection device may be implemented by a phase meter. The storage unit 42 may be implemented by a memory in the device. The comparison unit 43 and the determination unit 44 may be implemented by a Central Processing Unit (CPU), Digital Signal Processor (DSP) or Field-Programmable Gate Array (FPGA) in the device.

Those skilled in the art should understand that the embodiments of the present disclosure may be provided as a method, a system or a computer program product. Therefore, the present disclosure may adopt a form of hardware, software and a combination. Moreover, the present disclosure may adopt a form of computer program product implemented on one or more computer-available storage media (including, but not limited to, a disk memory, an optical memory or the like) including computer-available program codes.

The present disclosure is described with reference to flowcharts and/or block diagrams of the method, device and computer program product according to the embodiments of the present disclosure. It should be understood that each flow and/or block in the flowcharts and/or the block diagrams and combinations of the flows and/or blocks in the flowcharts and/or the block diagrams may be implemented by computer program instructions. These computer program instructions may be provided for a universal computer, a dedicated computer, an embedded processor or a processor of other programmable data processing equipment to generate a machine, so that a device for realizing a function specified in one flow or more flows in the flowcharts and/or one block or more blocks in the block diagrams is generated by the instructions executed through the computer or the processor of the other programmable data processing equipment.

These computer program instructions may also be stored in a computer-readable memory capable of causing the computer or the other programmable data processing equipment to work in a specific manner, so that a product including an instruction device may be generated by the instructions stored in the computer-readable memory, the instruction device realizing the function specified in one flow or many flows in the flowcharts and/or one block or many blocks in the block diagrams.

These computer program instructions may further be loaded onto the computer or the other programmable data processing equipment, so that a series of operating steps are executed on the computer or the other programmable data processing equipment to generate processing implemented by the computer, and steps for realizing the function specified in one flow or many flows in the flowcharts and/or one block or many blocks in the block diagrams are provided by the instructions executed on the computer or the other programmable data processing equipment.

The above is only the preferred embodiments of the present disclosure. It is noted that those skilled in the art may also make a plurality of improvements and embellishments without departing from the principle of the embodiments of the present disclosure, and these improvements and embellishments shall fall within the scope of protection of the present disclosure.

INDUSTRIAL APPLICABILITY

According to the embodiments of the present disclosure, the circuit parameter of the wireless energy transmission system is acquired; the acquired circuit parameter is compared with the pre-stored circuit parameter corresponding to the known air gap and dislocation distance information of the wireless energy transmission system; and the air gap and dislocation distance information of the non-contact transformer in the wireless energy transmission system are determined according to the comparison result. As such, the air gap and dislocation information of the non-contact transformer may be determined according to the circuit parameter of the wireless energy transmission system without other additional detection devices, so that the manpower consumption and expenses in material resources are greatly reduced, the detection flow is simplified and the efficiency of detection is improved.

The invention claimed is:

1. A detection method for a non-contact transformer, applied to a wireless energy transmission system, the method comprising:
   acquiring a circuit parameter of the wireless energy transmission system, wherein the acquired circuit parameter comprises a circuit parameter of a sender, a circuit parameter of a receiver and a coupling coefficient of the non-contact transformer, the circuit parameter of the sender comprises at least one of the following parameters: a phase angle between voltage and current or a value of switching frequency, and the circuit parameter of the receiver comprises at least one of the following parameters: a voltage value or a current value;
   comparing the acquired circuit parameter with a pre-stored circuit parameter corresponding to known air gap and dislocation distance information; and
   determining air gap and dislocation distance information of the non-contact transformer in the wireless energy transmission system according to a comparison result,
   wherein the step of determining the air gap and dislocation distance information of the non-contact transformer in the wireless energy transmission system according to the comparison result comprises:
      when the non-contact transformer has a serial-parallel compensation structure and an acquired coupling coefficient of the non-contact transformer is smaller than a pre-stored coupling coefficient of the non-contact transformer, determining that the air gap of the non-contact transformer is enlarged or the non-contact transformer has a dislocation; and
      when the acquired coupling coefficient of the non-contact transformer is bigger than the pre-stored coupling coefficient of the non-contact transformer, determining that the air gap of the non-contact transformer is reduced.

2. A detection method for a non-contact transformer, applied to a wireless energy transmission system, the method comprising:
   acquiring a circuit parameter of the wireless energy transmission system, wherein the circuit parameter comprises a circuit parameter of a sender, a circuit parameter of a receiver and a coupling coefficient of the non-contact transformer, the circuit parameter of the sender comprises at least one of the following parameters: a phase angle between voltage and current or a value of switching frequency, and the circuit parameter of the receiver comprises at least one of the following parameters: a voltage value or a current value;
   comparing the acquired circuit parameter with a pre-stored circuit parameter corresponding to known air gap and dislocation distance information; and
   determining air gap and dislocation distance information of the non-contact transformer in the wireless energy transmission system according to a comparison result,
   wherein the step of determining the air gap and dislocation distance information of the non-contact transformer in the wireless energy transmission system according to the comparison result comprises:
      when the non-contact transformer has a serial-parallel compensation structure, an impedance characteristic and a voltage gain of the non-contact transformer are monotonic, a phase angle between voltage and current of the sender is unchanged and an acquired value of switching frequency is bigger than a pre-stored value of switching frequency of the sender, determining that the air gap of the non-contact transformer is enlarged or the non-contact transformer has a dislocation; and
      when the acquired value of switching frequency is smaller than the pre-stored value of switching frequency of the sender, determining that the air gap of the non-contact transformer is reduced.

3. A detection method for a non-contact transformer, applied to a wireless energy transmission system, the method comprising:
   acquiring a circuit parameter of the wireless energy transmission system, wherein the acquired circuit parameter comprises a circuit parameter of a sender, a circuit parameter of a receiver and a coupling coefficient of the non-contact transformer, the circuit parameter of the sender comprises at least one of the following parameters: a phase angle between voltage and current or a value of switching frequency, and the circuit parameter of the receiver comprises at least one of the following parameters: a voltage value or a current value;
   comparing the acquired circuit parameter with a pre-stored circuit parameter corresponding to known air gap and dislocation distance information; and
   determining air gap and dislocation distance information of the non-contact transformer in the wireless energy transmission system according to a comparison result,
   wherein the step of determining the air gap and dislocation distance information of the non-contact transformer in the wireless energy transmission system according to the comparison result comprises:
      when the non-contact transformer has a serial-parallel compensation structure, an impedance characteristic and a voltage gain of the non-contact transformer are non-monotonic, a phase angle between voltage and current of the sender is unchanged and an acquired value of switching frequency is smaller than a pre-stored value of switching frequency of the sender, determining that the air gap of the non-contact transformer is enlarged or the non-contact transformer has a dislocation; and
      when the acquired value of switching frequency is bigger than the pre-stored value of switching frequency of the sender, determining that the air gap of the non-contact transformer is reduced.

4. A detection device for a non-contact transformer, comprising an acquisition unit, a storage unit, a comparison unit and a determination unit, wherein
   the acquisition unit is configured to acquire a circuit parameter of a wireless energy transmission system, wherein the circuit parameter acquired by the acquisition unit comprises a circuit parameter of a sender, a circuit parameter of a receiver and a coupling coefficient of the non-contact transformer, the circuit parameter of the sender comprises at least one of the following parameters: a phase angle between voltage and current or a value of switching frequency, and the circuit parameter of the receiver comprises at least one of the following parameters: a voltage value or a current value,
   the storage unit is configured to store a circuit parameter corresponding to known air gap and dislocation distance information,
   the comparison unit is configured to compare the circuit parameter acquired by the acquisition unit with the circuit parameter stored by the storage unit,
   the determination unit is configured to determine air gap and dislocation distance information of the non-contact transformer in the wireless energy transmission system according to a comparison result from the comparison unit, wherein the determination unit is configured to, when the non-contact transformer has a serial-parallel compensation structure and the comparison result from the comparison unit indicates that an acquired coupling coefficient of the non-contact transformer is smaller than a pre-stored coupling coefficient of the non-contact transformer, determine that the air gap of the non-contact transformer is enlarged or the non-contact transformer has a dislocation, and when the comparison result from the comparison unit indicates that the acquired coupling coefficient of the non-contact transformer is bigger than the pre-stored coupling coefficient of the non-contact transformer, the determination unit is configured to determine that the air gap of the non-contact transformer is reduced.

5. A detection device for a non-contact transformer, comprising an acquisition unit, a storage unit, a comparison unit and a determination unit, wherein the acquisition unit is configured to acquire a circuit parameter of a wireless energy transmission system wherein the circuit parameter acquired by the acquisition unit comprises a circuit parameter of a sender, a circuit parameter of a receiver and a coupling coefficient of the non-contact transformer, the circuit parameter of the sender comprises at least one of the following parameters: a phase angle between voltage and current or a value of switching frequency, and the circuit parameter of the receiver comprises at least one of the following parameters: a voltage value or a current value, the storage unit is configured to store a circuit parameter corresponding to known air gap and dislocation distance information, the comparison unit is configured to compare the circuit parameter acquired by the acquisition unit with the circuit parameter stored by the storage unit, the determination unit is configured to determine air gap and dislocation distance information of the non-contact transformer in the wireless energy transmission system according to a comparison result from the comparison unit, the determination unit is configured to, when the non-contact transformer has a serial-parallel compensation structure, an impedance characteristic and a voltage gain of the non-contact transformer are monotonic, a phase angle between voltage and current of the sender is unchanged and the comparison result from the comparison unit indicates that an acquired value of switching frequency is bigger than a pre-stored value of switching frequency of the sender, determine that the air gap of the non-contact transformer is enlarged or the non-contact transformer has a dislocation, and when the comparison result from the comparison unit indicates that the acquired value of switching frequency is smaller than the pre-stored value of switching frequency of the sender, the determination unit is configured to determine that the air gap of the non-contact transformer is reduced.

6. A detection device for a non-contact transformer, comprising an acquisition unit, a storage unit, a comparison unit and a determination unit, wherein the acquisition unit is configured to acquire a circuit parameter of a wireless energy transmission system wherein the circuit parameter acquired by the acquisition unit comprises a circuit parameter of a sender, a circuit parameter of a receiver and a coupling coefficient of the non-contact transformer, the circuit parameter of the sender comprises at least one of the following parameters: a phase angle between voltage and current or a value of switching frequency, and the circuit parameter of the receiver comprises at least one of the following parameters: a voltage value or a current value, the storage unit is configured to store a circuit parameter corresponding to known air gap and dislocation distance information, the comparison unit is configured to compare the circuit parameter acquired by the acquisition unit with the circuit parameter stored by the storage unit, the determination unit is configured to determine air gap and dislocation distance information of the non-contact transformer in the wireless energy transmission system according to a comparison result from the comparison unit, wherein the determination unit is configured to, when the non-contact transformer has a serial-parallel compensation structure, an impedance characteristic and a voltage gain of the non-contact transformer are non-monotonic, a phase angle between voltage and current of the sender is unchanged and the comparison result from the comparison unit indicates that an acquired value of switching frequency is smaller than a pre-stored value of switching frequency of the sender, determine that the air gap of the non-contact transformer is enlarged or the non-contact transformer has a dislocation, and when the comparison result from the comparison unit indicates that the acquired value of switching frequency is bigger than the pre-stored value of switching frequency of the sender, the determination unit is configured to determine that the air gap of the non-contact transformer is reduced.

7. A computer storage medium, computer-executable instructions stored therein, wherein the computer-executable instructions are configured to execute a detection method for a non-contact transformer, and the method is applied to a wireless energy transmission system and comprises:

acquiring a circuit parameter of the wireless energy transmission system, wherein the acquired circuit parameter comprises a circuit parameter of a sender, a circuit parameter of a receiver and a coupling coefficient of the non-contact transformer, the circuit parameter of the sender comprises at least one of the following parameters: a phase angle between voltage and current or a value of switching frequency; and the circuit parameter of the receiver comprises at least one of the following parameters: a voltage value or a current value;

comparing the acquired circuit parameter with a pre-stored circuit parameter corresponding to known air gap and dislocation distance information; and determining air gap and dislocation distance information of the non-contact transformer in the wireless energy transmission system according to a comparison result, wherein the step of determining the air gap and dislocation distance information of the non-contact transformer in the wireless energy transmission system according to the comparison result comprises:

when the non-contact transformer has a serial-parallel compensation structure and an acquired coupling coefficient of the non-contact transformer is smaller than a pre-stored coupling coefficient of the non-contact transformer, determining that the air gap of the non-contact transformer is enlarged or the non-contact transformer has a dislocation; and when the acquired coupling coefficient of the non-contact transformer is bigger than the pre-stored coupling coefficient of the non-contact transformer, determining that the air gap of the non-contact transformer is reduced.

\* \* \* \* \*